United States Patent [19]

Ahmed

[11] 4,230,998
[45] Oct. 28, 1980

[54] TELEVISION VERTICAL RAMP GENERATOR

[75] Inventor: Adel A. A. Ahmed, Annandale, N.J.

[73] Assignee: RCA Corporation, New York, N.Y.

[21] Appl. No.: 18,363

[22] Filed: Mar. 7, 1979

Related U.S. Application Data

[62] Division of Ser. No. 829,534, Aug. 31, 1977.

[51] Int. Cl.³ .............................................. H03K 3/282
[52] U.S. Cl. .................................... 331/111; 315/388; 331/153
[58] Field of Search ....................... 331/111, 143, 153; 315/387, 388

[56] References Cited

U.S. PATENT DOCUMENTS

| | | | |
|---|---|---|---|
| 3,439,221 | 4/1969 | Drummond | 315/388 |
| 3,735,192 | 5/1973 | Avery | 315/388 |
| 3,796,912 | 3/1974 | Funston | 315/387 |

*Primary Examiner*—Siegfried H. Grimm
*Attorney, Agent, or Firm*—Eugene M. Whitacre; William H. Meise; Scott J. Stevens

[57] ABSTRACT

A vertical sawtooth generator adaptable for integrated circuit application self-oscillates under control of a latch circuit. A circuit controls the linearity of the charging capacitor ramp voltage. High frequency components of the recurrent ramp occurring due to the retrace discharge current are reduced by controlling the discharge currents. The ramp rate is controlled by a single resistor external to an integrated circuit.

11 Claims, 6 Drawing Figures

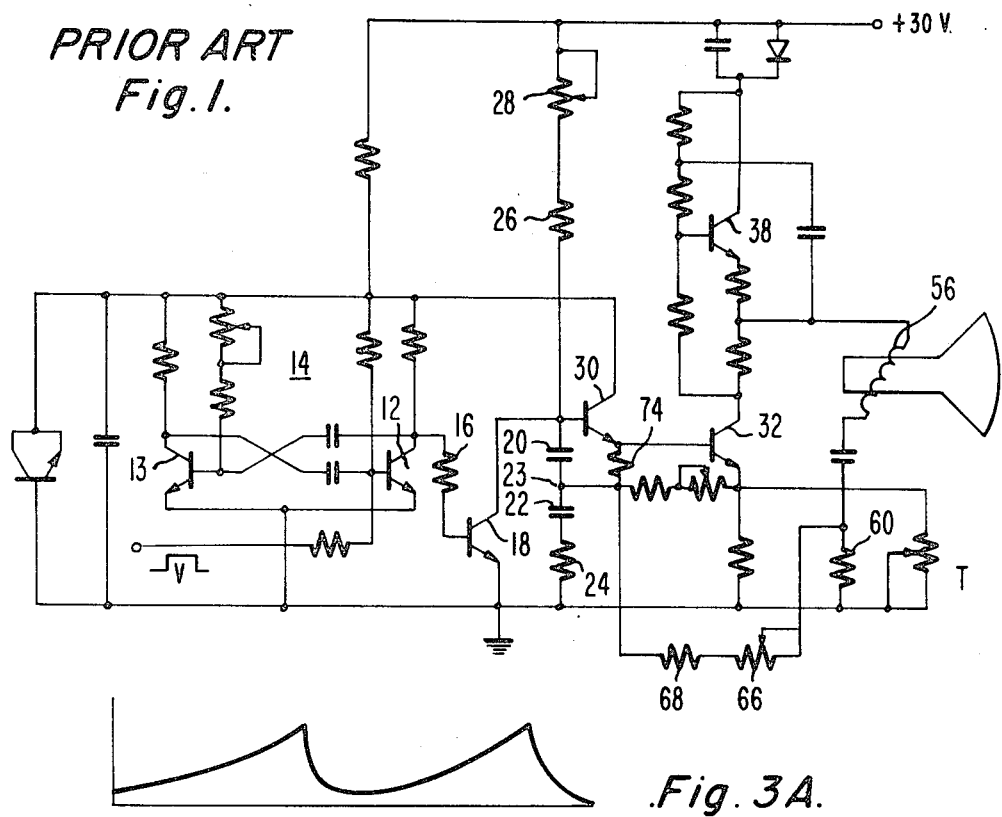
PRIOR ART
Fig. 1.
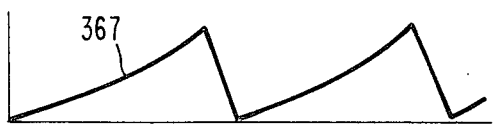
Fig. 3A.
Fig. 3B.
Fig. 3C.
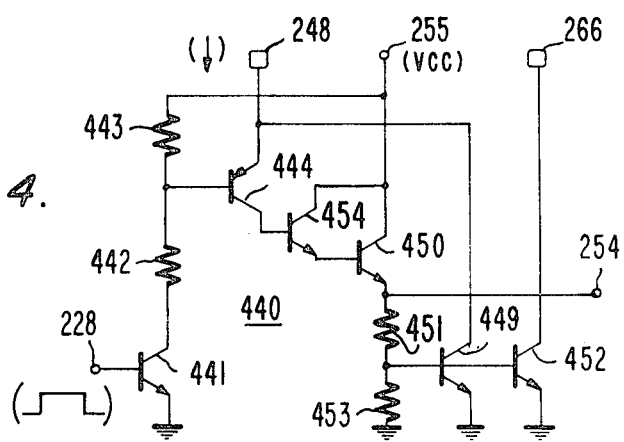
Fig. 4.

TELEVISION VERTICAL RAMP GENERATOR

This is a division, of application Ser. No. 829,534, filed Aug. 31, 1977.

BACKGROUND OF THE INVENTION

This invention relates to a sweep or ramp generator useful in conjunction with a television kinescope deflection arrangement.

A television vertical oscillator and deflection apparatus is shown in U.S. Pat. No. 3,735,192 issued on May 22, 1973 to Leslie Avery. This vertical deflection generator includes two charging capacitors coupled in series and to ground through a small resistor. Charging current is supplied to the capacitors from B+ through a resistance. A further charging current is provided for one of the capacitors by a further resistance driven by the voltage across one of the capacitors. During retrace, the series-coupled capacitors are discharged through the collector-to-emitter path of a switched transistor driven by a multivibrator synchronized with the horizontal synchronizing pulses. The ramp voltage appearing across the series-coupled capacitors drives a kinescope deflection coil through an output amplifier.

U.S. patent application Ser. No. 595,809, filed July 14, 1975 for Peter Eduard Haferl and entitled "SWITCHED VERTICAL DEFLECTION SYSTEM", now U.S. Pat. No. 4,048,544 describes a switched synchronous vertical deflection (SSVD) circuit in which the energy for the vertical deflection system is derived from the horizontal deflection system by means of switched reactances. The switched reactances are coupled to the horizontal deflection generator and operated during the horizontal retrace interval as a deflection amplifier. The SSVD arrangement is economically advantageous. However, it has been discovered that high-frequency components of the driving sawtooth or ramp retrace may cause undesirable ringing of the SSVD amplifier.

It is economically desirable to form the vertical sawtooth generator on a monolithic integrated circuit. It is also desirable to have a single type of integrated circuit adaptable for use with large numbers of different television receiver types and having different kinescope sizes and deflection yokes. Since the vertical retrace or flyback times are different for different yokes, it is desirable that such an integrated circuit have a retrace time which is easily and conveniently externally adjustable with suitable accuracy.

Since high-tolerance resistors cannot presently be fabricated economically in integrated-circuit form, it is necessary that the charging capacitors be charged from an external resistor. However, for purposes relating to raster linearity it is desirable that a voltage having a value equal to that at a point along the charging resistor be fed to the junction of the charging capacitors. This should be accomplished with a minimum number of interface terminals between the monolithic integrated circuit and external circuits.

SUMMARY OF THE INVENTION

A ramp generator comprises first and second serially coupled charging capacitors which are charged from a source of charging current coupled at one end to a first end of the serially coupled capacitor arrangement and at the other end to a source of potential, to form a ramp voltage across the first and second capacitors. A voltage divider is coupled from the first end of the first and second serially coupled charging capacitors to the source of potential. The voltage divider has a tap. Means are provided for coupling a charging current to the juncture of the first and second capacitors in response to the voltage at the tap.

DESCRIPTION OF THE DRAWINGS

In the drawings,

FIG. 1 is a diagram in schematic form of a prior art vertical deflection arrangement;

FIGS. 3A, 3B and 3C illustrate voltage waveforms appearing in the arrangements of FIGS. 1 and 2; and FIG. 4 is a schematic diagram of a gated current mirror which may be used in the arrangement of FIG. 2.

DESCRIPTION OF THE INVENTION

Figure 2:
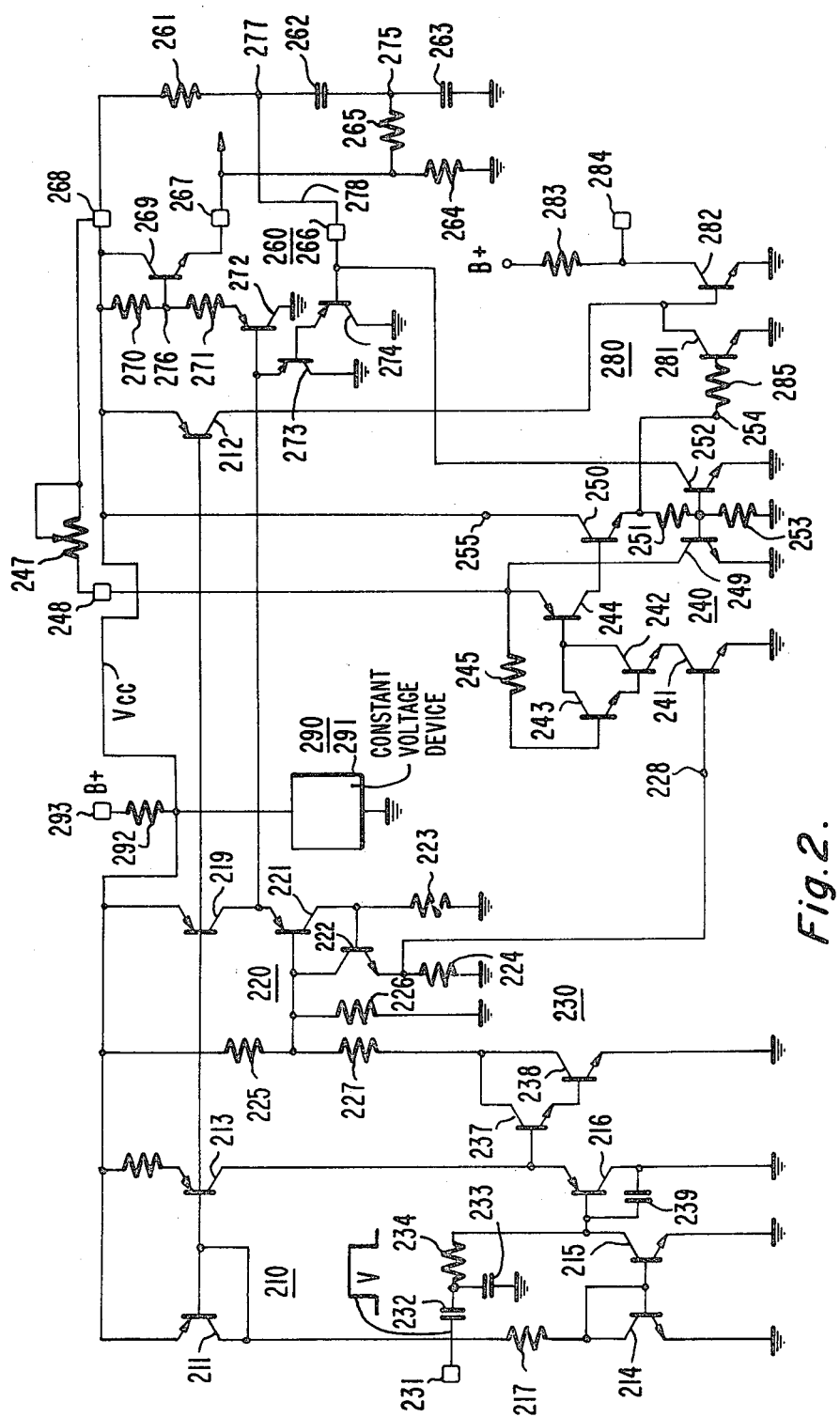
FIG. 2 is a diagram partially in block and partially in schematic form of a vertical deflection apparatus embodying the invention.

FIG. 1 is a schematic diagram of a vertical deflection multivibrator, sawtooth generator, and deflection amplifier according to U.S. Pat. No. 3,735,192. In the arrangement of FIG. 1, charging capacitors 20 and 22 are connected in series at a junction point 23. The lower plate of capacitor 22 is connected to ground through a resistor 24. The top plate of capacitor 20 is coupled to a +30 volt power supply through resistors 26 and 28, and receive charging current therefrom. The voltage at the top plate of capacitor 20 is coupled through an emitter follower transistor 30 to the base of a further transistor 32. The emitter of transistor 30 is coupled to junction point 23 by a resistor 74. As a result, capacitor 22 receives an additional charging current depending upon the voltage across capacitor 20. Transistor 32 forms with transistor 38 an output amplifier by which the ramp voltage at the top plate of capacitor 20 is amplified and applied across a vertical deflection coil 56 disposed about the neck of a kinescope. Deflection winding 56 is coupled in series with a current sampling resistor 60 and a feedback path is provided to the input of the deflection amplifier by way of resistors 66 and 68.

Capacitors 20 and 22 are periodically discharged by a retrace switched transistor 18. A multivibrator designated generally as 14 and including transistors 12 and 13 is synchronized to the vertical synchronizing signals. The output of multivibrator 14 is coupled to the base of transistor 18 by a resistor 16. Transistor 18 is periodically gated into conduction to discharge capacitors 20 and 22 during the vertical retrace interval.

When switch transistor 18 is rendered conductive, it becomes saturated and the relatively large capacitor voltage appears across resistor 24. This causes a relatively large discharge current during the initial portions of retrace which decays to a relatively small current during the latter portions of the retrace interval as shown in FIG. 3A. As mentioned, this causes relatively high frequency spectral components of the retrace portions of the ramp which may be unsuitable for SSVD applications. In the absence of a resistor such as 24, the saturation resistance of the switch transistor results in the same effect. However, since the saturation resistance varies from transistor to transistor, so will the retrace rate.

FIG. 2 is a diagram in schematic and block form of a vertical oscillator for producing a recurrent ramp or sawtooth voltage which may be used in conjunction with an SSVD amplifier or other deflection amplifier which may be sensitive to high frequency signal components.

Generally speaking, the arrangement of FIG. 2 includes at the far right two series-connected charging capacitors 262 and 263 external to an integrated circuit (IC) which are coupled to a linearizing circuit 260. The capacitor voltage is communicated to a voltage-sensitive IC latch circuit 220 at left of center. The latch circuit produces a control signal which is applied to an IC gated current mirror circuit 240 at bottom center which provides discharging current for the capacitors. The discharging current is controlled by an external resistor 247 near top center of FIG. 2. Also included within the IC are synchronizing signal coupling circuits 230 on the left, a shunt regulator circuit 290 at upper center and a blanking output amplifier 280 at the lower right.

The charging capacitance in FIG. 2 includes capacitor 262 coupled in series with a capacitor 263 and having a common junction point 275 therebetween. The end of capacitor 263 remote from point 275 is connected to ground, and the end of capacitor 262 remote from point 275 is connected to an external charging resistor 261 at a point 277. The other end of resistor 261 is coupled to supply voltage Vcc of the IC at an interface terminal 268. Point 277 is coupled by way of a conductor 278 and an interface terminal 266 to the base of an emitter follower transistor 274, the collector of which is connected to ground. The emitter of transistor 274 is connected to the base of a further emitter follower transistor 273, the collector of which is also connected to ground. The emitter of transistor 273 is connected to the base of yet a third emitter follower transistor 272 and to the emitter of a latch transistor 221. The emitter of transistor 272 is connected to supply by a voltage divider consisting of resistors 270 and 271, having a tap point 276 therebetween. Tap 276 is coupled to an output interface terminal 267 by an emitter follower transistor 269 and to a utilization means (not shown) such as a deflection amplifier. Output terminal 267 is coupled to junction point 275 by a resistor 265, and emitter follower 269 is supplied with operating current by an external resistor 264 coupled from terminal 267 to ground.

At the left of FIG. 2, resistor 217 supplies a constant current to diode-connected transistors 211 and 214 of a current source designated generally as 210. Diode 214 provides base-emitter biasing for a constant-current transistor 215, and diode 211 provides base-emitter biasing for constant-current transistors 212, 213 and 219. The collector of transistor 219 is coupled to the emitter of latch transistor 221 for providing operating current thereto. The base of transistor 221 is biased by a connection to the tap of a voltage divider consisting of resistors 225 and 226 connected between Vcc and ground. The collector of transistor 221 is coupled to ground by a load resistor 223 and to the base of a latch feedback transistor 222. The collector of transistor 222 is connected to the base of transistor 221 in a regenerative manner. The emitter of transistor 222 is connected to a point 228 and to ground by a resistor 224.

Vertical synchronizing pulses illustrated as V are applied to an interface terminal 231 at the left of FIG. 2. Terminal 231 is coupled to a voltage divider consisting of capacitors 232 and 233. The tap of the voltage divider is coupled by way of an integrator consisting of resistor 234 and capacitor 239 to the collector of constant-current transistor 215 and to the base of an emitter follower transistor 216, the collector of which is connected to ground. The emitter of transistor 216 is connected to the collector of transistor 213 for being supplied with operating current, and is also connected to the base of Darlington-connected transistors 237 and 238. The emitter of transistor 238 is connected to ground, and the collector is connected to the base of transistor 221 by way of a resistor 227. Latch 220 is synchronized with the vertical synchronizing pulses by the signal path extending from terminal 231 to the base of transistor 221.

The base of transistor 241 of gate controlled mirror 240 is connected to the emitter of transistor 222 by way of point 228. The emitter of transistor 241 is connected to ground, and the collector of transistor 241 is connected to the base of a transistor 244 through the emitter-collector junctioan of a transistor 242. The base of transistor 242 is connected to the base of a transistor 244 through the emitter-collector junction of a transistor 243. The base of transistor 243 is connected to the emitter of transistor 244 through a resistor 245. The emitter of transistor 244 is connected to an external resistor 247 by way of an interface terminal 248. The other end of resistor 247 is coupled to Vcc at interface terminal 268. The collector of transistor 244 is connected to the base of an emitter follower transistor 250, the collector of which is coupled to the supply by a conductor point 255. The emitter of transistor 250 drives a resistive voltage divider consisting of resistors 251 and 253, and also drives a blanking output amplifier 280 by way of a point 254. A transistor 249 has its base connected to the junction of resistors 251 and 253, its emitter connected to ground and its collector connected to the emitter of transistor 244. A capacitor discharging transistor 252 has its base connected to the junction of resistors 251 and 253, its emitter connected to ground and its collector connected to interface terminal 266.

Blanking output amplifier 280 includes an inverting amplifier transistor 281 having its base coupled to point 254 through a resistor 285 and its collector connected to the base of a transistor 282 and supplied with current by the collector of current source transistor 212. Transistor 282 is coupled as an inverting amplifier with a load resistor 283 and output interface terminal 284. The kinescope blanking signal at terminal 284 may be coupled to a kinescope in known manner.

The arrangement of FIG. 2 also includes a shunt regulator designated generally as 290. Regulator 290 includes a resistor 292 having one end connected to B+ at an interface terminal 293 and the other end connected to ground through a block 291. Block 291 represents a constant-voltage device such as zener diode. Supply voltage Vcc is taken from the lower end of resistor 292.

In operation during the trace interval, the transistors of latch 220 and gated mirror 240 are OFF or nonconducting. A positive-going or increasing ramp voltage appears at terminal 266 as capacitor 262 and 263 charge and is coupled to the emitter of transistor 273 with a 2 Vbe offset. An attenuated version of the ramp appears at external terminal 267, and a linearizing current flows through resistor 265 in dependence upon the voltage at terminal 267. The capacitor charging rate can be controlled by single external resistor 261 without affecting the linearity, which is established by voltage divider 270, 271 and resistor 265.

The ramp voltage appearing at terminal 266 also raises the emitter voltage of initially OFF latch transistor 221. When the voltage at the emitter of transistor 221 exceeds the voltage established at its base by the voltage divider consisting of resistors 225 and 226, by one Vbe, transistors 221 and 222 turn ON in a regenerative manner.

The regenerative switching of latch 220 raises the emitter voltage of transistor 222, causing transistor 241 to saturate. Saturation of transistor 241 causes diodes 242 and 243 to conduct, and the base of transistor 244 goes to 2 Vbe. Transistor 244 becomes conductive, and transistors 249, 250 and 252 are rendered conductive. Transistor 249 is conditioned to accept substantially all the current in resistor 247, and by mirror action transistor 252 discharges the capacitors with a current proportional to the current in transistor 249. Resistors 251 and 253 are dimensioned to provide a voltage at the emitter of transistor 250 which is sufficient to saturate transistor 281, thereby producing a sharp blanking pulse transition.

The discharge of capacitors 262 and 263 by a constant current through transistor 252 produces a substantially linear retrace ramp voltage, as shown in FIG. 3B. The capacitors are discharged to approximately the saturation voltage of transistor 252, at which time the base voltage of transistor 273 decreases below the base voltage of transistor 221, so transistor 273 conducts the collector current of transistor 219 and transistor 221 becomes nonconductive. When transistor 221 becomes nonconductive, its base voltage rises to that determined by resistors 225 and 226, turning off transistor 222, mirror 240 and output amplifier 280 to reinstate the initial condition. Capacitors 262 and 263 again begin to charge for another cycle period.

The free-running frequency of the above-described oscillator is set slightly lower than the synchronizing signal frequency. In the absence of a synchronizing signal, transistor 215 maintains transistor 216 conductive and transistors 237 and 238 nonconductive. In this condition, no current is drawn through resistor 227 and there is no effect on the latch circuit. During a positive-going signal at terminal 231, transistor 216 is rendered nonconductive and the collector current of constant-current transistor 213 causes transistor 237 to saturate, making resistor 227 part of the voltage divider at the base of transistor 221. Conduction in resistor 227 lowers the base voltage of transistor 221, thereby causing regenerative latching and initiating retrace.

In the arrangement of FIG. 2, it may be desirable to further reduce the magnitude of high-frequency components by reducing the retrace discharge rate late in the discharge interval. This can readily be accomplished by substituting a resistor between terminal 266 and point 277 in place of conductor 278. FIG. 3C illustrates the effect of use of such a resistor. In FIG. 3C, sawtooth 367 represents the output waveform at terminal 267 for the arrangement of FIG. 2. Dotted waveform portion 378 represents the waveform alteration available by substituting a resistor for conductor 278.

FIG. 4 is a schematic diagram of a gated current mirror designated generally as 440 which may be connected to terminals 248 and 266, points 228, 254 and 255 and to ground of FIG. 2 in place of current mirror 240. In FIG. 4, point 228 is connected to the base of a transistor 441, the emitter of which is connected to ground. A voltage divider consisting of resistors 442 and 443 is connected between point 255 and the collector of transistor 441. A tap on the voltage divider is connected to the base of a transistor 444, the emitter of which is connected to terminal 248. The collector of transistor 444 drives the base of Darlington-connected transistors 450 and 454, the collectors of which are connected to point 255. The emitter of transistor 450 is connected to ground by a voltage divider consisting of resistors 451 and 453, and is also connected to point 254. The base emitter junctions of current source transistors 449 and 452 are connected across resistor 453. The collector of transistor 449 is coupled to the emitter of transistor 444. The collector of transistor 452 is connected to terminal 266.

During the trace interval, transistor 441 is nonconductive and the base-emitter of transistor 444 is not forward biased. Transistors 449 through 452 are not conductive.

At the beginning of the retrace interval, transistor 441 is saturated by a pulse applied to its base. This grounds the lower end of the voltage divider including resistors 442 and 443, and transistor 444 is biased for conduction. This forward-biases transistor 454 and 450, and also forward-biases transistors 449 and 452 by way of the voltage divider including resistors 451 and 453. Transistor 449 conducts substantially all the current entering terminal 248, and by mirror action transistor 452 is conditioned to demand a proportional current at terminal 266. Resistor 451 is dimensioned in a manner similar to resistor 251 to provide a voltage at terminal 254 capable of saturating the collector of a following stage.

Gated current mirror 440 provides better external control of the retrace current than does mirror 240, because the current in transistor 449 equals the current in resistor 247, while the current in transistor 249 is less by the amount of current flow in resistor 245.

The described arrangement provides linearized retrace determined by an externally accessible resistor together with the possibility of partial exponential decay, also under external control if desired. The trace interval is determined by external components with a slaved internal voltage divider for feedback linearity correction, thereby reducing the number of interface terminals. Also, the arrangement provides a maximum ramp amplitude consistent with the desired linearity correction by driving the ramp voltage to within one saturation voltage of ground. A synchronous kinescope blanking output is provided.

Other embodiments of the invention will be apparent to those skilled in the art. For example, peak loading of the shunt regulator may be reduced by proportioning the geometries of discharging transistors 252 (or 452) to transistor 249 (or 449) so as to reduce the current in control resistor 247 to a fraction of the capacitor discharge current. Resistors 264 and 265 may be formed within the integrated circuit rather than without. The charging circuit may be connected between floating power supplies rather than with one end grounded. The usual temperature compensation and other stabilization measures may also be included.

For a particular vertical deflection application, component values for the arrangement of FIG. 2 were as follows:

| VOLTAGE REFERENCE | |
|---|---|
| 291 | 9.1 volts |
| RESISTORS | |
| 292 | 1200 ohms |
| 251 | 2200 |
| 265 | 8.4K |
| 213,217,234,245,253,271,264,283 | 10K |
| 225,227 | 18K |
| 285 | 20K |

-continued

| | |
|---|---|
| 226 | 22K |
| 224 | 68K |
| 270 | 82K |
| 261 | 130K |
| CAPACITORS | |
| 232 | .01μf |
| 233 | 4700pf |
| 239 | 2200pf |

What is claimed is:

1. A ramp generator comprising:
   first and second serially coupled charging capacitance means including a juncture therebetween;
   a source of potential defined between a point of supply potential and a point of reference potential;
   means, including a first source of charging current coupled between a first end of said first and second charging capacitance means and said point of supply potential and a connection between a second end of said charging capacitance means and said point of reference potential, for forming a ramp voltage across said first and second capacitance means;
   voltage division means comprising first and second end terminals and having a tap therebetween, said first end terminal connected to said point of supply potential;
   first coupling means coupled between said first end of said first and second charging capacitance means and said second end terminal of said voltage division means, for coupling said voltage division means in parallel with said first source of charging current; and
   second coupling means for coupling said tap to said juncture of said first and second serially coupled capacitance means for applying a second charging current to said juncture in response to the voltage at said tap;
   voltage sensing means coupled to said first end of said capacitance means for generating a control signal when said ramp voltage reaches a predetermined level; and
   constant current discharge means coupled between said first end of said capacitance means and said point of reference potential and responsive to said control signal for providing a constant current discharge path for said capacitance means.

2. A ramp generator according to claim 1 wherein said voltage division means is formed within an integrated circuit; and said first and second serially coupled charging capacitance means and said first source of charging current are extrinsic to said integrated circuit.

3. A ramp generator according to claim 1 wherein:
   said second coupling means comprises impedance transformer means having an input coupled to said voltage division means and having an output; and
   third coupling means for coupling said output to said juncture.

4. A ramp generator according to claim 3 wherein said impedance transformer means comprises an emitter follower.

5. A ramp generator according to claim 3 wherein said third coupling means comprises resistance means coupled from said output of said impedance transformer means to said juncture.

6. A ramp generator according to claim 5 wherein said impedance transformer means and voltage division means are formed within an integrated circuit, and said resistance means is extrinsic to said integrated circuit.

7. A ramp generator according to claim 1 wherein said second coupling means comprises resistance means.

8. A ramp generator according to claim 1 wherein said first coupling means provides direct coupling.

9. A ramp generator according to claim 1 wherein said first coupling means comprises impedance transformer means.

10. A ramp generator according to claim 1 wherein said first coupling means comprises an emitter follower.

11. A ramp generator according to claim 1 wherein said first coupling means provides an offset voltage.

* * * * *